(12) United States Patent
Urushima

(10) Patent No.: US 6,515,357 B2
(45) Date of Patent: Feb. 4, 2003

(54) SEMICONDUCTOR PACKAGE AND SEMICONDUCTOR PACKAGE FABRICATION METHOD

(75) Inventor: Michitaka Urushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/073,104

(22) Filed: Feb. 12, 2002

(65) Prior Publication Data

US 2002/0072152 A1 Jun. 13, 2002

Related U.S. Application Data

(62) Division of application No. 09/832,095, filed on Apr. 11, 2001, now Pat. No. 6,372,549.

(30) Foreign Application Priority Data

Apr. 24, 2000 (JP) ........................................ 2000-123156

(51) Int. Cl.[7] .............................................. H01L 23/02
(52) U.S. Cl. ..................................................... 257/678
(58) Field of Search ............................... 438/106, 108, 438/118; 257/678, 700, 701, 734, 737, 738, 778, 783

(56) References Cited

U.S. PATENT DOCUMENTS

| | | | |
|---|---|---|---|
| 5,710,071 A | 1/1998 | Beddingfield et al. | |
| 5,768,109 A | 6/1998 | Gulick et al. | |
| 5,818,113 A | 10/1998 | Iseki et al. | |
| 5,834,799 A | 11/1998 | Rostoker et al. | |
| 5,834,844 A | * 11/1998 | Akagawa et al. | 257/734 |
| 6,013,944 A | 1/2000 | Moriya et al. | |
| 6,020,220 A | 2/2000 | Gilleo et al. | |
| 6,118,183 A | * 9/2000 | Umehara et al. | 257/783 |
| 6,228,688 B1 | 5/2001 | Ohta et al. | |
| 6,297,553 B1 | * 10/2001 | Horiuchi et al. | 257/737 |
| 6,303,878 B1 | 10/2001 | Kondo et al. | |
| 6,316,288 B1 | * 11/2001 | Hashimoto | 438/118 |
| 6,335,563 B1 | * 1/2002 | Hashimoto | 257/632 |

FOREIGN PATENT DOCUMENTS

| | | |
|---|---|---|
| EP | 0 704 899 | 4/1996 |
| EP | 0 834 917 | 4/1998 |
| JP | 7-321157 | 12/1995 |
| JP | 8-102474 | 4/1996 |
| JP | 10-340969 | 12/1998 |

* cited by examiner

Primary Examiner—Michael Sherry
Assistant Examiner—Scott B. Geyer
(74) Attorney, Agent, or Firm—Sughrue Mion, PLLC

(57) ABSTRACT

The semiconductor package is highly reliable and has a construction that enables an improvement of fabrication yield and that can greatly reduce the number of steps and the amount of time required for those steps. The semiconductor package has a construction in which wiring layer 14 is supported by insulating film 13 over a range corresponding to chip electrodes 12 of semiconductor chip 11. In the fabrication of this semiconductor package, the semiconductor chip 11 is mounted on an interposer constituted by the wiring layer 14, insulating film 13, and adhesive layer 16 by inserting bumps 17 into holes 16a in adhesive layer 16, following which the metal junctions between the wiring layer 14 and all bumps 17 as well as adhesion between semiconductor ship 11 and wiring tape 4 by means of adhesive layer 16 are realized simultaneously by using a heater plate to apply heat to adhesive layer 16 and inner lead connectors while pressing wiring tape 4 across substantially the entire range of the chip electrode formation surface.

6 Claims, 7 Drawing Sheets

SEMICONDUCTOR PACKAGE AND SEMICONDUCTOR PACKAGE FABRICATION METHOD

This is a divisional of application Ser. No. 09/832,095 filed Apr. 11, 2001 now U.S. Pat. No. 6,372,549; the disclosure of which is incorporated herein by reference.

BACKGROUND OF THE INVENTION

1. Field of the Invention

The present invention relates to a semiconductor package wherein an interposer (wiring base material) that is provided with a wiring layer having a prescribed wiring pattern on an insulating base material is adhered to an electrode formation surface of a semiconductor chip by means of an adhesive layer; the wiring layer and electrodes of the semiconductor chip connect by way of bump contacts (bump electrodes); i.e., are electrically connected by the flip-chip method; and external connectors are provided on the surface of the wiring layer that is opposite from the surface that is joined to the semiconductor chip. The present invention also relates to a fabrication method of such a semiconductor package.

2. Description of the Related Art

The research and development of higher-density semiconductor device packages is currently making great strides, and many configurations and methods have been proposed for the configuration of a package. In particular, a high-density semiconductor package known as a Chip Scale Package (CSP) in which the package size has been miniaturized to a size that is substantially equal to chip size is receiving attention, and a variety of developments have been achieved.

The form of a semiconductor package that is suitable for constructing a CSP is:

a semiconductor package in which an interposer, in which a wiring layer of, for example, copper wiring having a prescribed wiring pattern is arranged on an insulating base material such as polyimide tape, is adhered to the electrode formation surface of a semiconductor chip by way of an adhesive layer; electrodes, such as aluminum electrodes, of the semiconductor chip are electrically connected to a wiring layer by way of bumps such as gold ball bumps; i.e., by the so-called flip-chip method; and external connectors are provided on the side of the wiring layer that is opposite from the junction surface with the semiconductor chip. In this case, external connectors are, for example, solder balls that are attached to lands of the wiring layer or similar lands.

Semiconductor packages of the prior art having this type of construction can be classified into two types according to the positional relation between the semiconductor chip, the insulating base material, the wiring layer, and the adhesive layer. The first type is characterized by a configuration in which the positioning order is: semiconductor chip, adhesive layer, insulating base material, and wiring layer. The second type is a configuration in which the positioning order is: semiconductor chip, adhesive layer, wiring layer, and insulating base material.

Prior art that belongs to the first type is disclosed in the explanation pertaining to FIG. 2 and FIG. 4 of Japanese Patent Laid-open No. 321157/95, and in the explanation pertaining to FIG. 4 and FIG. 9 of Japanese Patent Laid-open No. 102474/96. Prior art that belongs to the second type is disclosed in the explanation pertaining to FIG. 1 and FIG. 3 of Japanese Patent Laid-open No. 321157/95, and in the explanation pertaining to FIG. 3 and FIG. 8 of Japanese Patent Laid-open No. 102474/96.

Turning now to the accompanying figures, explanation is next presented regarding the construction and fabrication method of semiconductor packages of the above-described first type and second type.

FIG. 1 shows a sectional view of semiconductor package 2 of one example of the prior art, and FIG. 2 is an enlarged view of portion B in FIG. 1.

This semiconductor package 2 of the prior art is the above-described first type of semiconductor package and has a construction in which semiconductor chip 21 is applied to wiring tape 5 by means of adhesive layer 26. As shown in FIG. 2, this portion is constructed by laminating in the order: semiconductor chip 21, adhesive layer 26, insulating film 23 as the insulating base material, copper wiring 24 as the wiring layer, and cover resist 29 that insulates and covers copper wiring 24.

Chip electrodes 22 and copper wiring 24 are electrically connected by way of filled copper bumps 27 that fill holes that are formed in adhesive layer 26 and insulating film 23. Gold plating (not shown in the figures) is applied to the contacting surfaces of chip electrodes 22 and filled copper bumps 27 to form gold-gold metal junctions. Cover resist 29 is provided with holes 29b at positions where solder balls 28 are attached as the external terminals, and is provided with holes 29a at positions that correspond to chip electrodes 22. Solder balls 28 contact copper wiring 24 at holes 29b. Reinforcement resin 30 is formed on wiring tape 5 around the periphery of semiconductor chip 21.

When assembling semiconductor package 2, the adhesive surface that is formed by adhesive layer 26 of wiring tape 5 is temporarily secured on the electrode formation surface of semiconductor chip 21 on which chip electrodes 22 are formed; bonding tool 50 is passed through holes 29a and placed in contact with copper wiring 24, and pressure and ultrasonic waves are applied to the connector portion (inner lead connectors) chip electrode 22 and filled copper bumps 27. In a case in which semiconductor chip 21 is provided with, for example, 1000 chip electrodes 22, this bonding operation by means of bonding tool 50 must be carried out a total of 1000 times.

Next, complete adhesion between semiconductor chip 21 and wiring tape 5 can be obtained by applying appropriate heat and pressure to adhesive layer 26.

The construction and method of fabricating a semiconductor package of the second type is next explained with reference to the figures. FIG. 3 shows a sectional view of semiconductor package 3 of an example of the prior art, and FIG. 4 shows an enlarged view of portion C in FIG. 3.

This prior-art semiconductor package 3 is a semiconductor package of the second type, and has a construction in which semiconductor chip 31 and wiring tape 6 having adhesive layer 36 are adhered together. As shown in FIG. 4, a section of this semiconductor package 3 is of a construction in which semiconductor chip 31, adhesive layer 36, copper wiring 34 as the wiring layer, and insulation film 33 as insulating base material are laminated in that order. In contrast with semiconductor package 2 of the first type, copper wiring 34 is covered by insulating film 33 and adhesive layer 36, and a cover resist is therefore not used.

Chip electrodes 32 and copper wiring 34 are electrically connected by way of gold ball bumps 37 that are inserted into holes that are formed in adhesive layer 36. Gold plating (not shown in the figures) is applied to the surfaces of copper wiring 34 that contact the gold ball bumps so as to form a gold-gold metal junction. In insulating film 33, holes 33b are provided at the positions at which solder balls 38 are arranged as external terminals, and holes 33a are provided at positions that correspond to chip electrodes 32. Solder balls 38 contact copper wiring 34 in holes 33b.

When assembling semiconductor package 3, the adhesive surface that is arranged on adhesive layer 36 of wiring tape 6 is temporarily secured to the electrode formation surface of semiconductor chip 31 upon which gold ball bumps 37 are arranged at chip electrodes 32, i.e., temporarily secured on the surface on which chip electrodes 32 are formed; and bonding tool 50 is passed through holes 33a and placed against copper wiring 34, following which pressure and ultrasonic waves are applied to the connectors (inner lead connectors); i.e., between gold ball bumps 37 and chip electrodes 32 and between gold ball bumps 37 and copper wiring 34. In a case in which, for example, 1000 chip electrodes 32 are provided on semiconductor chip 31, this bonding operation by bonding tool 50 must be performed a total of 1000 times.

An appropriate degree of heat and pressure are then applied to adhesive layer 36 to obtain complete adhesion between semiconductor chip 31 and wiring tape 6.

In the publications of Japanese Patent Laid-open No. 321157/95 and Japanese Patent Laid-open No. 102474/96, bonding is achieved when assembling the semiconductor package by first carrying out single-point bonding, which is the bonding operation by means of bonding tool 50, and then applying pressure and heat.

The semiconductor packages and the methods of their fabrication of the prior art that are disclosed in Japanese Patent Laid-open No. 321157/95 and Japanese Patent Laid-open No. 102474/96 have the following problems.

Semiconductor package 2 of the prior art necessitates the use of a cover resist, and moreover, necessitates the formation of filled bumps in holes that are formed in the adhesive layer and insulating base material. These requirements result in an increase in the number of steps as well as an increase in cost. Furthermore, with the current advances in miniaturization of semiconductor devices, the extremely small size of holes that are to be filled with bumps complicates the formation of the filled bumps. As a result, there are the problems of decreases in both yield and the reliability of connection between the wiring layer and filled bumps.

Prior-art semiconductor package 3, on the other hand, does not require the use of a cover resist, and to this extent, semiconductor package 3 requires fewer steps than semiconductor package 2. However, semiconductor package 3 still entails the burden of a process for forming holes 33a in the insulating base material for the insertion of the bonding tool.

In particular, since the insulating base material is harder than the adhesive layer, the process of opening holes in the insulating base material is a more burdensome process.

Furthermore, both examples of the prior art employ the application of ultrasonic waves and pressure by a bonding tool for each chip electrode (single-point bonding) to realize connection in the process of bonding the electrodes of the semiconductor chip and the wiring layer through the use of bumps according to the flip-chip method. There is consequently the problem that the more pins used by a semiconductor chip, the more time and labor that are required, and the higher the fabrication cost.

Finally, in both examples of the prior art, the process of adhering together the semiconductor chip and the wiring tape; i.e., the interposer, is separate from the process of bonding that connects the wiring layer and the electrodes of the semiconductor chip. There is consequently the problem that the adhering process also entails time and labor and increases the fabrication cost.

SUMMARY OF THE INVENTION

The present invention was realized with the object of solving the problems of the above-described prior art, and has as an object the provision of a semiconductor package, as well as a method of fabricating the semiconductor package, that enables a large reduction in both the number of steps and the amount of time required for the steps, that enables an improvement in fabrication yield, and moreover, that is highly reliable; this semiconductor package being a semiconductor package in which: an interposer, in which a wiring layer having a prescribed wiring pattern is arranged on an insulating base material, is adhered to the electrode formation surface of a semiconductor chip by means of an interposed adhesive layer; the electrodes of the semiconductor chip and the wiring layer are electrically connected by means of interposed bumps according to the flip-chip method; and external connectors are provided on the surface of the wiring layer that is on the opposite side from the surface that is adhered to the semiconductor chip.

According to the semiconductor package of a first invention of the present application for solving these problems, in a semiconductor package in which:

an interposer, in which a wiring layer having a prescribed wiring pattern is arranged on an insulating base material and an adhesive layer in which holes are formed is arranged on the wiring layer, and a semiconductor chip, in which bumps are affixed to electrodes, are adhered together such that the adhesive layer confronts the electrode formation surface of the semiconductor chip; moreover, the bumps are inserted into the holes and the electrodes of the semiconductor chip and the wiring layer are electrically connected by way of the bumps according to the flip-chip method; and external connectors are provided on the surface of the wiring layer that is opposite from the surface that is adhered to the semiconductor chip;

wherein the wiring layer is supported by an insulating base material within a range corresponding to the electrodes of the semiconductor chip.

Therefore, according to the semiconductor package of the first invention of this application, the wiring layer is supported by the insulating base material within at least the range corresponding to the electrodes of the semiconductor chip, thereby enabling suitable fabrication by the fabrication method of the invention as described hereinbelow and offering the advantage of reducing the number of steps and reducing the time required for the steps. In addition, the burden of the process of forming holes in the insulating base material is alleviated because the number of locations in the insulating base material in which holes are formed is reduced.

Furthermore, the bumps are inserted into holes that are provided in the adhesive layer and the chip electrodes and wiring layer are electrically connected by way of these bumps according to the flip-chip method. As a result, the first invention has the advantages of improving the reliability of connections between the chip electrodes and the wiring layer, sealing the junction surface between the semiconductor chip and the interposer by means of the adhesive, and further, improving both fabrication yield and reliability.

The method of fabricating the semiconductor package of the first invention of the present application is described below as the second invention of the present application.

The second invention of the present application is a method of fabricating a semiconductor package comprising steps of:

arranging bumps on electrodes of a semiconductor chip;

fabricating an interposer by forming a wiring layer having a prescribed wiring pattern on an insulating base material, forming an adhesive layer on the surface on which the wiring layer is arranged, and then providing holes at positions that will confront electrodes of the semiconductor chip when the semiconductor chip is mounted;

mounting the semiconductor chip on the interposer by placing the surface of the semiconductor chip in which the electrodes are formed in confrontation with the surface of the interposer on which the adhesive layer is formed and then inserting the bumps into the holes; and realizing metal junctions between the wiring layer and bumps and adhering the semiconductor chip and interposer by means of the adhesive layer by applying heat to inner lead connectors that include the adhesive layer and bumps while pressing the interposer against substantially the entire surface of the semiconductor chip on which the electrodes are formed.

Thus, according to the semiconductor package and method of fabricating a semiconductor package of the second invention of the present application, metal junctions are realized between the wiring layer and the bumps, and bonding is realized between the semiconductor chip and the interposer by means of the adhesive layer by applying heat to the inner lead connectors that include the adhesive layer and the bumps while pressing the interposer against substantially the entire surface of the semiconductor chip on which the electrodes are formed. As a result, inner lead bonding of all electrodes on the semiconductor chip, bonding of the semiconductor chip and interposer, and sealing of the junction surfaces are accomplished all at once, thereby realizing the advantages of both greatly decreasing the number of steps and greatly reducing the amount of time required by the steps in the fabrication of the semiconductor package.

In a case in which 1000 electrodes are provided on a semiconductor chip, for example, the single-point bonding method of the prior art requires a total of 100 seconds to complete the process at the rate of 0.1 seconds to bond a single electrode. According to the present invention, however, not only all bonding but adhesion as well are completed in just a few seconds, thereby realizing a great advantage in terms of both time and economy.

Furthermore, providing an adhesive layer on the surface of the interposer on which the wiring layer is arranged, and then providing holes in the adhesive layer at positions that will confront the electrodes of the semiconductor chip obtains the advantage of preventing the entrapment of air under the adhesive layer.

In addition, mounting the semiconductor chip on the interposer by inserting the bumps into the holes of the adhesive layer obtains the advantage that positioning is extremely easy and reliable.

If, for example, a method of the prior art is adopted in which a semiconductor chip, an interposer that lacks an adhesive layer, and an adhesive sheet having holes are used and in which the semiconductor chip and the interposer are positioned, following which the adhesive sheet is sandwiched between the semiconductor chip and the interposer with the holes of the adhesive sheet positioned over the bumps that have been added on the chip electrodes, and then caused to adhere; not only is there the concern that air or other substances may be trapped under the adhesive layer, but assembly and positioning are extremely problematic and perhaps impossible in the case of miniaturization of the semiconductor device.

A laser processing method, plasma etching method, or lithographic method may be used for carrying out the micro-processing of holes.

In addition, in the method of fabricating the semiconductor package, a plurality of semiconductor chips may be mounted on a uniform interposer, following which individual semiconductor packages are separated. This method of fabricating semiconductor packages has the advantage of allowing not only inner lead bonding of all electrodes on a plurality of semiconductor chips, but bonding and sealing of the junction surfaces of the plurality of semiconductor chips and interposers to be performed all at once, thereby simultaneously obtaining a plurality of semiconductor packages and greatly reducing the number of steps and the time required for the steps in the fabrication of semiconductor packages.

In a case of mounting 30 semiconductor devices each provided with 1000 electrodes, the single-point bonding method of the prior art requires a total of 3000 seconds to complete the process at the rate of 0.1 seconds to bond a single electrode. The present invention, in contrast, completes not only all bonding but, in addition, completes sealing in just 10~20 seconds, thereby realizing an advantage in terms of both time and economy.

In the method of fabricating a semiconductor package, the pressure of the level surface of a heated pressure part against the rear surface of the semiconductor chip may be used to heat the inner lead connectors that include the adhesive layer and bumps while pressing the interposer against substantially the entire surface of the electrode formation surface of the semiconductor chip.

This method has the advantage of easily realizing inner lead bonding and adhesion. For example, a large number of semiconductor packages can be fabricated in a short time by using a heater plate to press a large number of semiconductor chips mounted on a uniform interposer.

The method of fabricating a semiconductor package may be realized by mounting a plurality of semiconductor chips on a uniform interposer, arranging this interposer on a silicon sheet, and then applying heat and pressure by a heater plate from above the semiconductor chips within a vacuum.

In the method of fabricating a semiconductor package, the conditions for applying heat and pressure to cause adhesion and the conditions for applying heat and pressure for obtaining the metal junction may be set substantially equal.

This method enables the application of heat and pressure that is neither insufficient nor excessive to both the adhesive layer and the inner lead connectors. This has the advantages of enabling satisfactory states of both adhesion and metal junction and enabling a further shortening of the time required for fabrication steps.

In the method of fabricating a semiconductor package, a thermoplastic resin may be used as the adhesive layer.

The use of a thermoplastic resin in the adhesive layer enables the easy separation of the semiconductor chips from the wiring substrate by reheating. This has the advantage of enabling the individual exchange of defective articles even after a large number of semiconductor chips have been adhered to a uniform interposer.

The above and other objects, features, and advantages of the present invention will become apparent from the following descriptions based on the accompanying drawings which illustrate an example of a preferred embodiment of the present invention.

DETAILED DESCRIPTION OF THE PREFERRED EMBODIMENTS

Turning now to the accompanying figures, an embodiment of a semiconductor package and the method of fabricating the package according to the present invention are next explained. The following explanation relates to an embodiment and does not limit the present invention.

Figure 1:
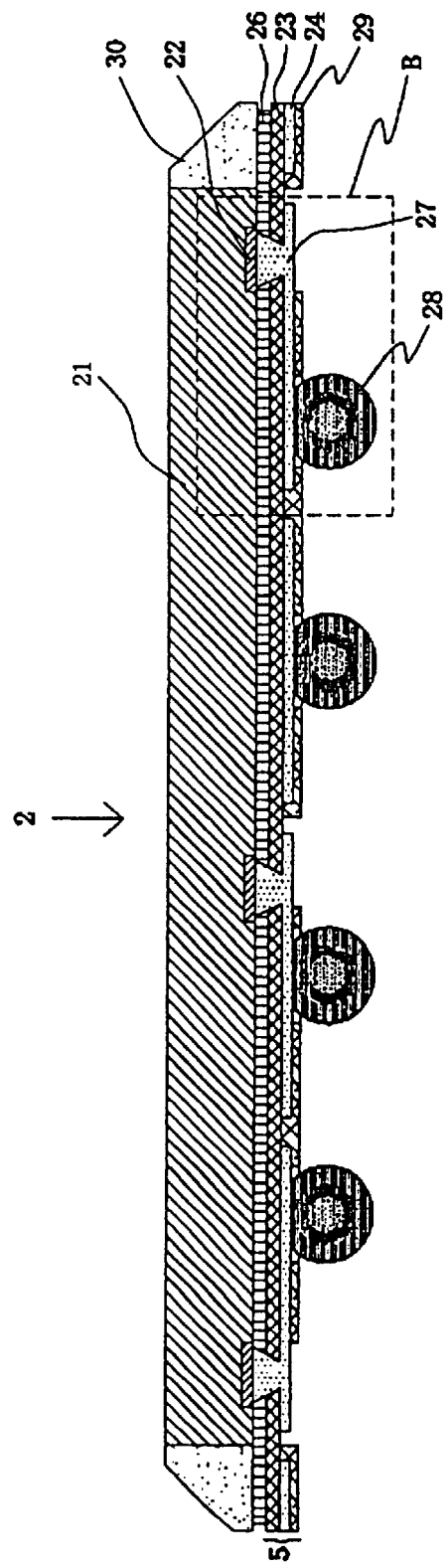
FIG. 1 is a sectional view of semiconductor package 2 of one example of the prior art.
Figure 2:
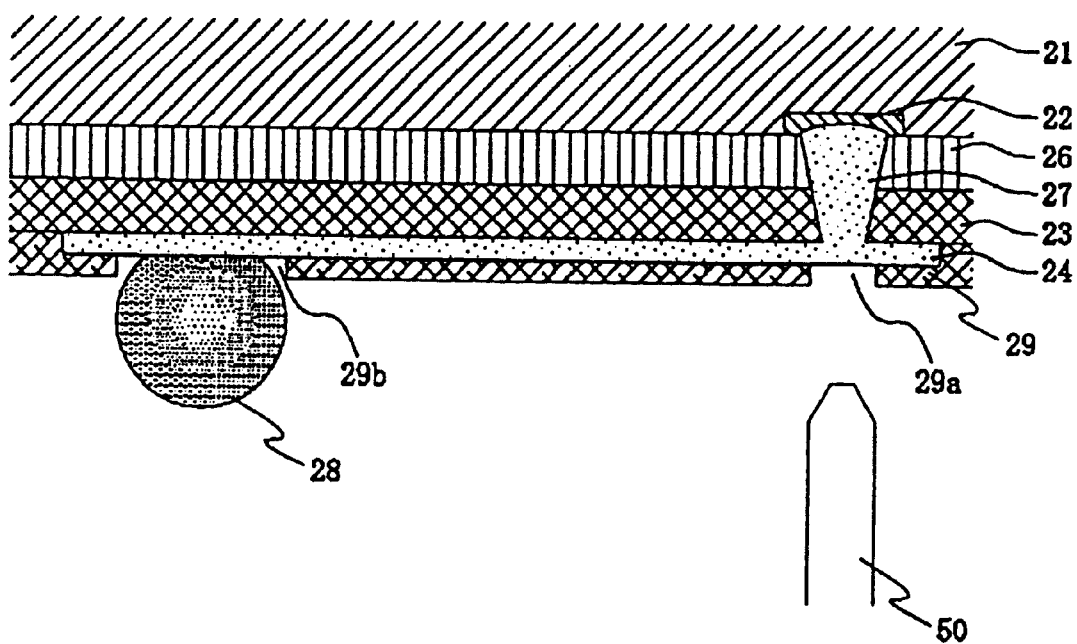
FIG. 2 is an enlarged view of portion B in FIG. 1.
Figure 3:
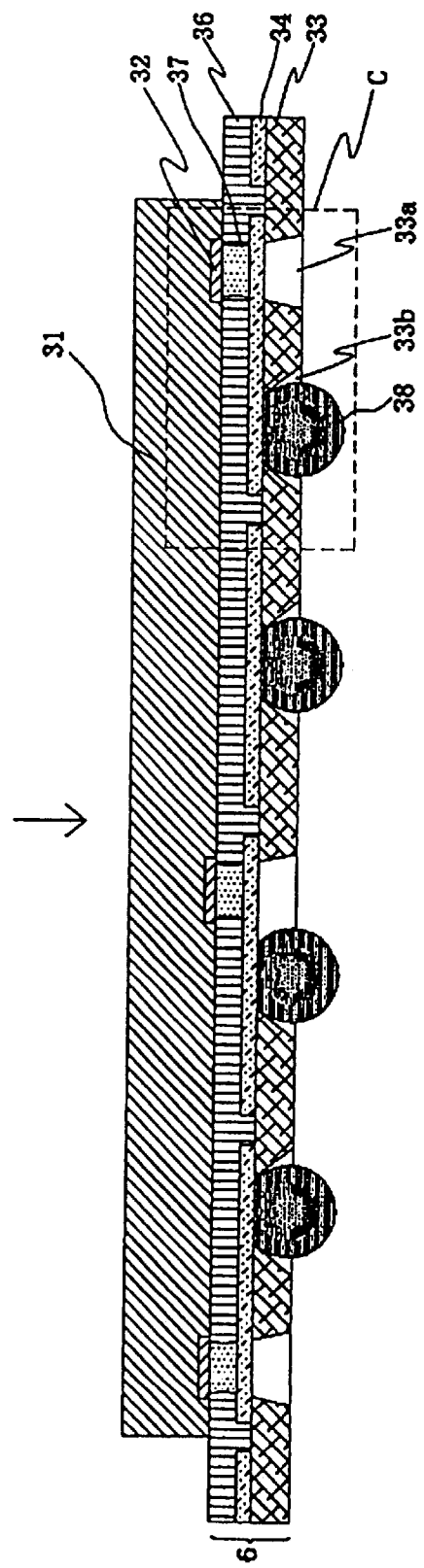
FIG. 3 is a sectional view of semiconductor package 3 of one example of the prior art.
Figure 4:
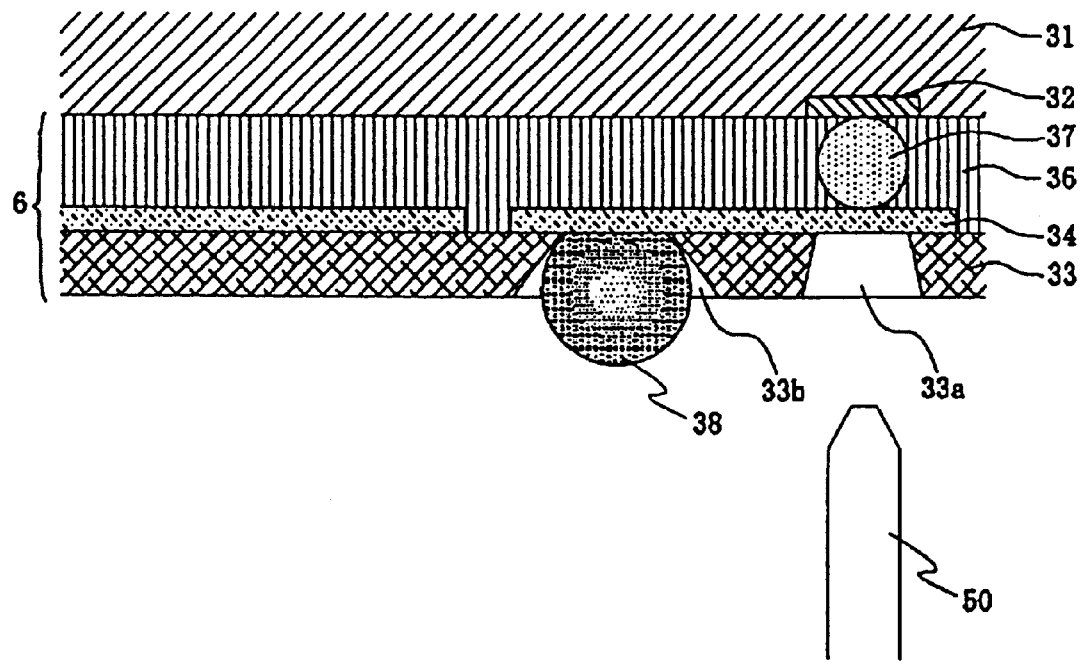
FIG. 4 is an enlarged view of portion C in FIG. 3.
Figure 5:
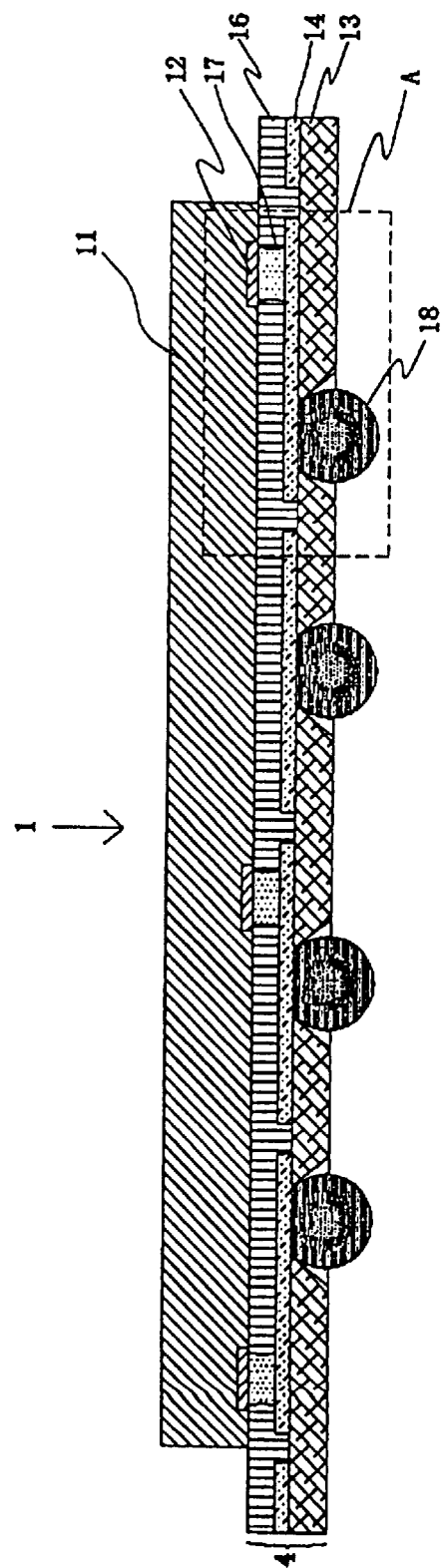
FIG. 5 is a sectional view showing semiconductor package 1 of an embodiment of the present invention.

First, regarding the construction of semiconductor package 1 of an embodiment of the present invention, we turn to FIG. 5, which is a sectional view showing semiconductor package 1 of an embodiment of the present invention.

As shown in FIG. 5, semiconductor package 1 of the present embodiment has a construction in which semiconductor chip 11 and wiring tape 4 as the interposer are bonded together.

Wiring tape 4 is made up by: insulating film 13 as the insulating base material that is composed of polyimide; copper wiring 14 as the wiring layer that has a prescribed wiring pattern; and adhesive layer 16 composed of a thermoplastic resin. Copper wiring 14 is arranged on insulating film 13, and gold plating 15 is applied to its surface. Adhesive layer 16 is arranged on the main surface of insulating film 13, on which copper wiring 14 has been arranged, and is provided with holes.

Chip electrodes 12, which are the electrodes of semiconductor chip 11, are composed of aluminum. Gold plating is applied to the surface of chip electrodes 12, and gold ball bumps 17 are in turn provided on the gold plating.

Semiconductor package 1 of this embodiment has a construction in which semiconductor chip 11 and wiring tape 4 are adhered together with adhesive layer 16 of wiring tape 4 confronting the electrode formation surface of semiconductor chip 11.

In addition, semiconductor package 1 of this embodiment has a construction in which: gold ball bumps 17 are inserted into holes 16a of adhesive layer 16; chip electrodes 12 and copper wiring 14 are electrically connected by way of gold ball bumps 17 according to the flip-chip method; and solder balls 18 are provided as the external connectors on the surface of copper wiring 14 that is on the opposite side from the surface of semiconductor chip 11.

In addition, copper wiring 14 is supported by insulating film 13 within the range that corresponds to chip electrodes 12. In other words, holes are not provided and copper wiring is not exposed within the range that corresponds to chip electrodes 12 of insulating film 13.

Next, regarding the method of fabricating semiconductor package 1, the method of fabricating wiring tape 4 is first explained with reference to FIGS. 6A~6F.

Figure 6A:
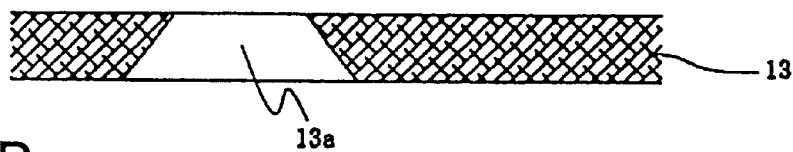
FIGS. 6A~6F are sectional views showing the fabrication steps of wiring tape 4 in portion A of FIG. 5.

A multiple-pattern large-scale insulating film 13 is prepared, and holes 13a are formed by a laser machining method in the areas where the external connectors are to be formed (FIG. 6A).

Figure 6B:
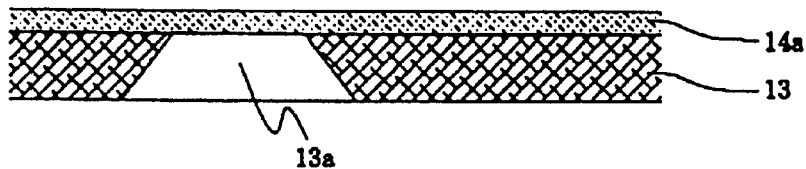

Next, copper foil 14a is arranged on insulating film 13 by a lamination method (FIG. 6B).

Figure 6C:
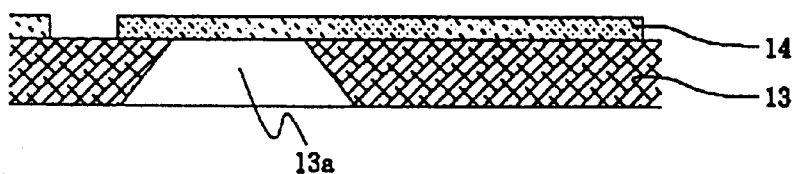

Copper foil 14a is next formed in a predetermined wiring pattern by a lithographic process to obtain copper wiring 14 (FIG. 6C).

Figure 6D:
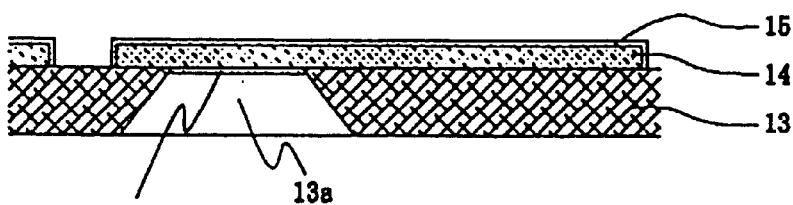

Gold plating 15 and 19 is next applied to copper wiring 14 (FIG. 6D).

Figure 6E:
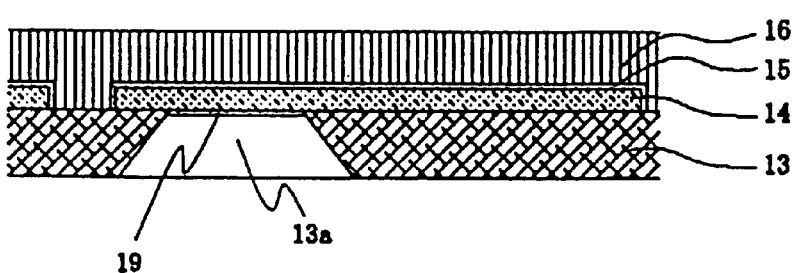

Adhesive layer 16 composed of a thermoplastic resin is then formed by a lamination method on the main surface of insulating film 13 on which copper wiring 14 has been formed (FIG. 6E).

Figure 6F:
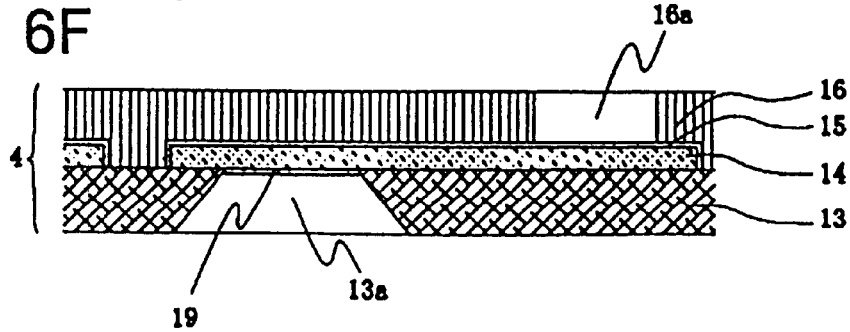

Next, holes 16a are formed by a laser machining process or plasma etching in the areas of adhesive layer 6 which are to become the inner lead connectors (FIG. 6F).

Multiple-pattern large-scale film carrier wiring tape 4 is thus completed by proceeding through the above-described steps.

On the other hand, gold ball bumps 17 are provided on chip electrodes 12 of semiconductor chip 11 by a ball bonding method. The formation of gold ball bumps 17 by this ball bonding method is carried out as follows:

Using a wire bonding device, a gold ball is formed at the tip of a gold wire that issues from a capillary, and this gold ball is pressed against chip electrode 12. The capillary is next caused to vibrate ultrasonically to ultrasonically fuse the gold ball to chip electrode 12, following which the gold wire is cut. As described above, gold ball bumps 17 are formed on chip electrodes 12.

The assembly steps of a semiconductor package are next explained with reference to FIGS. 7A~7C.

Figure 7A:
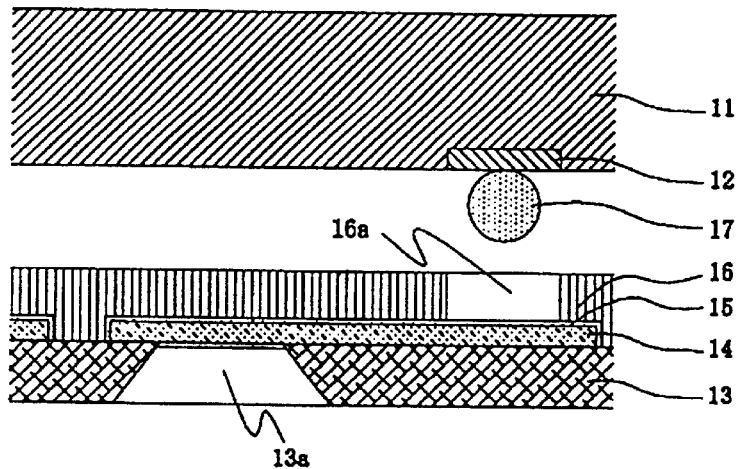
FIGS. 7A~7C are sectional views showing the fabrication steps of semiconductor package 1 in portion A of FIG. 5.
Figure 7B:
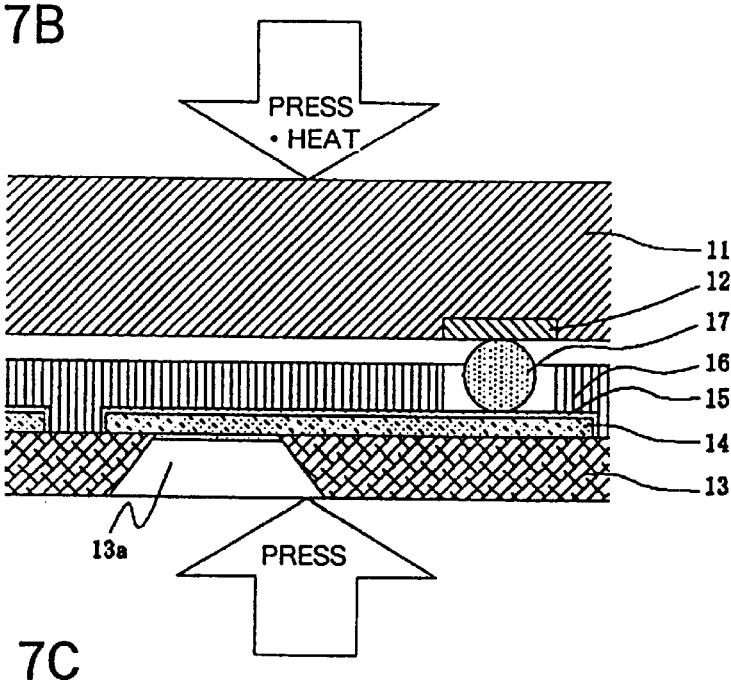

First, the side of semiconductor chip 11 on which chip electrodes 12 are formed is lowered such that this surface confronts the surface of multiple-pattern wiring tape 4 on which adhesive layer 16 is provided, gold ball bumps 17 that are provided on chip electrodes 12 are inserted into holes 16a that are provided in adhesive layer 16, and semiconductor chip 11 is mounted on the interposer that is constituted by wiring tape 4 (FIGS. 7A~7B). This process facilitates positioning, and moreover, gold ball bumps 17 are inserted into holes 16a and thus anchored, whereby semiconductor chip 11 cannot be easily separated from wiring tape 4. The subsequent workability is accordingly improved. A large number of semiconductor chips are similarly positioned and mounted on wiring tape 4.

Holes 16a are preferably formed at a diameter that is larger than the width of gold ball bumps 17 to allow gold ball bumps 17 to be inserted into holes 16a without placing a load on gold ball bumps 17.

Wiring tape 4 on which a large number of semiconductor chips 11 have been mounted is arranged on a silicon sheet (not shown in the figures) having a thickness of approximately 0.2~1.0 mm, and the ambient air is removed to form a vacuum.

A single heater plate (not shown) is then lowered from above and pressed against the rear surface (the side that is opposite from the side of the electrode formation surface) of the large number of semiconductor chips 11, whereby heat is applied to the inner lead connectors (to gold ball bumps 17 in particular) and adhesive layer 16 while wiring tape 4 is pressed against substantially the entire surface on which chip electrodes 12 are formed in each semiconductor chip 11.

At this time, copper wiring 14 is supported by insulating film 13 within the range that corresponds to chip electrodes 12, and the pressure of the heater plate can therefore be reliably transmitted to the inner lead connectors. In addition, a portion of the silicon sheet is forced into holes 13a and supports copper wiring 14, whereby wiring tape 4 is adequately pressed against the surface of semiconductor chip 11 on which chip electrodes 12 are formed even within the range of holes 13a.

Excellent adhesion without the occurrence of entrapped air between semiconductor chip 1 and adhesive layer 16 can be achieved because this pressure is exerted in a vacuum.

The adhesive that is used on adhesive layer 16 is selected in advance such that the heating value and pressure value for obtaining optimum adhesion are substantially equal to the heating value and pressure value for obtaining optimum metal junctions.

The metal junctions between copper wiring 14 and gold ball bumps 17 and the adhesion between semiconductor chip 11 and wiring tape 4 by adhesive layer 16 are completed by both fusing gold ball bumps 17 and hardening adhesive layer 16 as described above (FIGS. 7B~7C), and an excellent adhesive state and metal junction state can thus be obtained. The occurrence of voids between the surface of semiconductor chip 11 on which chip electrodes 12 are formed, and adhesive layer 16 is prevented by carrying out the process inside a vacuum. Concern regarding the occurrence of voids increases with chip size. In such a case, carrying out adhesion inside a vacuum as in the present embodiment is effective.

Figure 7C:
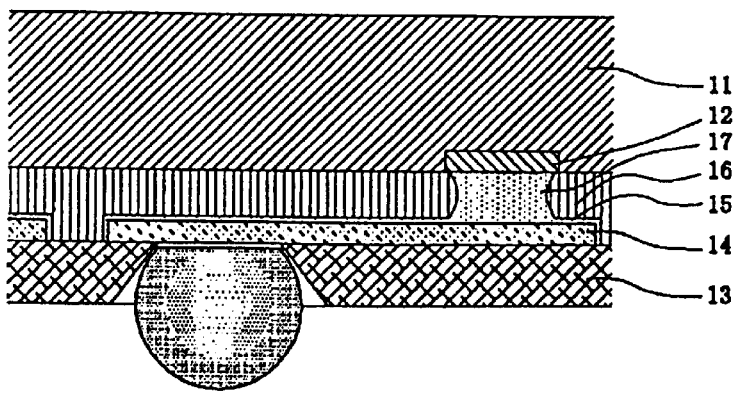

Solder balls 18 are next arranged in holes 13a as external terminals (FIG. 7C). Wiring tape 4 is then cut to separate individual semiconductor packages 1.

A semiconductor package 1 as shown in FIG. 5 is completed by performing the above-described steps.

As another construction, a reinforcing plate composed of metal or resin may be formed to secure wiring tape 4 around the perimeter of semiconductor chip 11 of semiconductor package 1 shown in FIG. 5.

Further, a construction may also be adopted in which the rear surface and side surface of semiconductor chip 11 of semiconductor package 1 shown in FIG. 5 are covered by a resin composed of, for example, epoxy.

A construction may also be adopted to raise heat dissipation in which a heat-sink plane composed of, for example, copper is bonded to the rear surface of semiconductor chip 11 of semiconductor package 1 shown in FIG. 5.

A multi-chip package may also be constructed by further applying a second semiconductor chip by, for example, an adhesive to the rear surface of semiconductor chip 11, connecting the electrodes of this second semiconductor chip to copper wiring 14 on wiring tape 4 by gold wires, and covering with a resin such as epoxy. In such a case, a multi-chip package may be constructed by further applying a third semiconductor chip that has a smaller area than the second semiconductor chip onto the second semiconductor chip by, for example, an adhesive; connecting the electrodes of the third semiconductor chip to copper wiring 14 on wiring tape 4 with gold wires similar to the second semiconductor chip; and covering with a resin composed of, for example, epoxy.

Although gold ball bumps were used as bumps 17 for internal connections in the above-described embodiment, the present invention is not limited to this form, and other materials such as solder bumps and copper bumps may be used. Although a stud bump method in which wire bonding technology was applied was used as the method of forming bumps, the present invention is not limited to this form, and other methods such as a plating method, an evaporation method, and a transferring method may be used.

Although a flexible wiring tape 4 in which the insulating base material was a polyimide film was used as the interposer in the above-described embodiment, the present invention is not limited to this form and materials such as a ceramic substrate or an epoxy substrate may be used.

Although solder balls 18 were used as the external terminals in the above-described embodiment, the present invention does not limit these terminals to a ball shape, and shapes such as bumps or lands may be used.

Further, although holes 16a of adhesive layer 16 were formed by a laser machining method in the above-described embodiment, these holes may be formed using a photosensitive adhesive and patterning by lithography.

A working example is next described based on actual values. This working example conforms to the above-described embodiment.

Regarding dimensions, the thickness of insulating film 13 was 75 $\mu$m, the layer thickness of adhesive layer 16 was 30 $\mu$m on insulating film 13 and 15 $\mu$m over copper wiring 14, and the film thickness of copper wiring 14 was 15 $\mu$m. The thickness of resulting wiring tape 4 was therefore 105 $\mu$m.

The height of gold ball bumps 17 was 20 $\mu$m. Wiring tape 4 was secured to a frame, and 30 semiconductor chips 11 were mounted per frame. DRAMLSI chips 10 mm square and having 1000 pins were used as semiconductor chips 11. A thermoplastic resin having a thermosetting component that thermosets sufficiently at 300° C. was used as the adhesive used in adhesive layer 16.

In the step for simultaneously realizing inner lead bonding and adhesion, the heating temperature of the heater plate was 300° C., the pressure value was 980 mN per bump, and the pressing time was 20 seconds per frame. An excellent adhesion state and metal junction state were achieved under these conditions.

In the present invention as described hereinabove, the wiring layer is supported by the insulating substrate within the range that corresponds to the electrodes of the semiconductor chip, and a tool such as a heater plate is pressed against the rear surface of the semiconductor chip, whereby heat can be applied to the adhesive layer and inner lead connectors while applying pressure against the interposer over substantially the entire surface of the electrode formation surface of the semiconductor chip. As a result, the present invention simultaneously realizes the inner lead bonding of all electrodes on the semiconductor chip and the sealing of the adhesive and junction surfaces between the semiconductor chip and the interposer. The present invention therefore has the effect of greatly reducing the number of steps in semiconductor package fabrication and greatly reducing the amount of time required in steps, and is extremely advantageous when dealing with a large number of pins.

In addition, an adhesive layer is formed on the surface of the interposer on which the wiring layer is formed, following which holes are provided at positions of the adhesive layer that correspond to the electrodes of the semiconductor chip, and this has the effect of preventing entrapment of air under the adhesive layer.

Further, the semiconductor chip is mounted on the interposer by inserting bumps into the holes in the adhesive layer, and this procedure has the effect of making positioning extremely easy and reliable, and enabling the efficient fabrication of high-density semiconductor packages of advanced miniaturization.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor package comprising:

a complete interposer, in which a wiring layer having a prescribed wiring pattern is formed on an insulating base material and an adhesive layer having holes is formed on said wiring layer, and a semiconductor chip, in which bumps are arranged on electrodes are adhered together such that said adhesive layer confronts the electrode formation surface of said semiconductor chip;

said bumps are inserted into said holes of said adhesive layer and electrodes of said semiconductor chip and said wiring layer are electrically connected by way of said bumps according to the flip-chip method; and external connectors are provided on the surface of said wiring layer that is opposite from the surface that is adhered to said semiconductor chip;

wherein said insulating base material extends completely beneath at least one of said adhesive layer holes; and wherein said wiring layer is supported by said insulating base material at least within an area in which electrodes of said semiconductor chip are connected.

2. A semiconductor package comprising:

a complete pre-formed interposer, further comprising:
   (a) an insulating layer,
   (b) a wiring layer mated to said insulating layer, said wiring layer having a prescribed wiring pattern and at least one external connector; and
   (c) an adhesive layer mated to, and adhered to, said wiring pattern, said adhesive layer having at least one hole;

a semiconductor chip with an electrode formation surface, said electrode formation surface having at least one electrode;

wherein said at least one hole is formed in said adhesive layer to allow electronic mating between said wiring layer and said semiconductor chip;

wherein at least one bump is coupled to said at least one electrode;

wherein said semiconductor chip is mounted upon said adhesive layer such that said adhesive layer confronts, and is adhered to, said electrode formation surface of said semiconductor chip;

wherein said at least one bump is inserted into said at least one hole of said adhesive layer such that said semiconductor chip and said wiring layer are electrically connected by way of said at least one bump according to a flip-chip method;

wherein said wiring layer is supported by said insulating base material at least within an area in which said at least one electrode of said semiconductor chip is connected; and wherein said at least one external connector of said wiring layer is provided on an external connector surface of said wiring layer, said external connector surface being opposite from said electrode formation surface that is adhered to said semiconductor chip; and wherein said insulating layer extends completely beneath said at least one hole in said adhesive layer.

3. The semiconductor package according to claim 2, wherein said bumps are gold ball bumps.

4. The semiconductor package according to claim 2, wherein said an insulating layer is relatively harder than said adhesive layer.

5. The semiconductor package according to claim 2, wherein said insulating layer of said complete pre-formed interposer is formed without the need for forming a hole for an insertion of a bonding tool.

6. The semiconductor package according to claim 2, wherein said adhesion of said interposer and the semiconductor substrate are adhesively attached, thereby establishing said electrical connection between said semiconductor chip and said wiring layer.

* * * * *